United States Patent
Wei et al.

(10) Patent No.: US 7,141,883 B2
(45) Date of Patent: Nov. 28, 2006

(54) INTEGRATED CIRCUIT PACKAGE CONFIGURATION INCORPORATING SHIELDED CIRCUIT ELEMENT STRUCTURE

(75) Inventors: Derrick C. Wei, Austin, TX (US); Ying Shi, Austin, TX (US); Kevin G. Smith, Austin, TX (US); Steven P. Proffitt, Austin, TX (US); Axel Thomsen, Austin, TX (US); David M. Pietruszynski, Austin, TX (US); Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/463,961

(22) Filed: Jun. 18, 2003

(65) Prior Publication Data

US 2004/0222506 A1     Nov. 11, 2004

Related U.S. Application Data

(60) Provisional application No. 60/418,546, filed on Oct. 15, 2002.

(51) Int. Cl.
*H01L 23/48* (2006.01)
*H01L 23/552* (2006.01)

(52) U.S. Cl. .................. 257/778; 257/660; 257/686

(58) Field of Classification Search ............... 257/685, 257/686, 777, 778
See application file for complete search history.

(56) References Cited

U.S. PATENT DOCUMENTS

| | | | |
|---|---|---|---|
| 5,083,236 A | 1/1992 | Chason et al. | |
| 5,446,311 A | 8/1995 | Ewen et al. | |
| 5,459,368 A * | 10/1995 | Onishi et al. | 310/313 R |
| 5,461,353 A | 10/1995 | Eberhardt | |
| 5,559,360 A | 9/1996 | Chiu et al. | |
| 5,760,456 A | 6/1998 | Grzegorek et al. | |
| 5,793,272 A | 8/1998 | Burghartz et al. | |
| 5,884,990 A | 3/1999 | Burghartz et al. | |
| 5,918,121 A | 6/1999 | Wen et al. | |
| 5,959,515 A | 9/1999 | Cornett et al. | |

(Continued)

FOREIGN PATENT DOCUMENTS

EP     0 675 539 A2     10/1995

(Continued)

OTHER PUBLICATIONS

"Unitive—CSP On the Edge", Unitive Inc. 2003 (from website - http://unitive.com/cspedge/index.cfm), 2 pages.

(Continued)

*Primary Examiner*—Hung Vu
(74) *Attorney, Agent, or Firm*—Zagorin O'Brien Graham LLP

(57) ABSTRACT

An electromagnetically-shielded high-Q inductor may be fabricated within a multi-layer package substrate (MLS). The inductor is preferably constructed as a loop structure on a layer of the MLS, and a shielding structure is formed around the inductor to substantially enclose the inductor in a Faraday cage-like enclosure. The shielding structure includes a top plate formed above the inductor on another layer of the MLS, and a bottom plate formed on yet another layer of the MLS or on a layer of an integrated circuit die which is below and attached to the MLS, preferably using solder bumps. Shielding structure sidewalls may be formed by a ring of stacked vias or via channels. The inductor is preferably connected to stacked vias which provide a connection to the underlying integrated circuit die by way of additional solder bumps and cut-outs through the bottom plate of the shielding structure.

43 Claims, 10 Drawing Sheets

U.S. PATENT DOCUMENTS

| | | | |
|---|---|---|---|
| 5,959,522 | A | 9/1999 | Andrews |
| 6,008,102 | A | 12/1999 | Alford et al. |
| 6,037,649 | A | 3/2000 | Liou |
| 6,046,109 | A | 4/2000 | Liao et al. |
| 6,054,329 | A | 4/2000 | Burghartz et al. |
| 6,114,937 | A | 9/2000 | Burghartz et al. |
| 6,124,624 | A | 9/2000 | Van Roosmalen et al. |
| 6,146,958 | A | 11/2000 | Zhao et al. |
| 6,153,489 | A | 11/2000 | Park et al. |
| 6,169,008 | B1 | 1/2001 | Wen et al. |
| 6,218,729 | B1 | 4/2001 | Zavrel, Jr. et al. |
| 6,362,525 | B1 * | 3/2002 | Rahim ................ 257/738 |
| 6,389,691 | B1 | 5/2002 | Rinne et al. |
| 6,486,534 | B1 | 11/2002 | Sridharan et al. |
| 6,501,169 | B1 | 12/2002 | Aoki et al. |
| 6,534,843 | B1 | 3/2003 | Acosta et al. |
| 6,653,557 | B1 | 11/2003 | Wolf et al. |
| 6,873,065 | B1 | 3/2005 | Haigh et al. |
| 2002/0109204 | A1 | 8/2002 | Acosta et al. |
| 2002/0140081 | A1 | 10/2002 | Chou et al. |
| 2004/0178472 | A1 | 9/2004 | Zhang et al. |
| 2004/0222478 | A1 | 11/2004 | Zhang et al. |
| 2004/0222511 | A1 | 11/2004 | Zhang |

FOREIGN PATENT DOCUMENTS

WO    WO 02/067326 A2    8/2002

OTHER PUBLICATIONS

"Unitive Design Guidelines", www.unitive.com, 2001, pp. 1-18.

Frommberger, Michael, et al., "Integration of Crossed Anisotropy Magnetic Core Into Toroidal Thin-Film Inductors," IEEE Transactions on Microwave Theory and Techniques, vol. 53, No. 6, Jun. 2005, pp. 2096-2100.

Kim, Sung-Jin, et al., "Realization of High-Q Inductors Using Wirebonding Technology," School of Electronics Engineering, Ajou University, AP-ASIG Proceedings, Aug. 1999, 4 pages.

Long, John R. and Miles A. Copeland, "The Modeling, Characterization, and Design of Monolithic Inductors for Silicon RF IC's," IEEE Journal of Solid-State Circuits, vol. 32, No. 3, Mar. 1997, pp. 357-369.

Soh, H. T., et al., "Through-Wafer Vias (TWV) and their Applications in 3 Dimensional Structures," Proceedings of 1998 International Conference on Solid State Devices and Materials, Sep. 1998, 12 pages.

Tang, Chih-Chun, et al., "Miniature 3-D Inductors in Standard CMOS Process," IEEE Journal of Solid-State Circuits, vol. 37, No. 4, Apr. 2002, pp. 471-480.

Treleaven, Dave and Dick James, "Integrated Circuit Passive Components," Whitepapers, Chipworks, www.chipworks.com/resources/resources_whitepapers.asp, 4 pages.

Tsui, Hau-Yiu and Jack Lau, 2003 IEEE MTT-S Digest, pp. 225-228.

Wu, Joyce H., et al., "A Through-Wafer Interconnect in Silicon for RFICs," IEEE Transactions on Electron Devices, vol. 51, No. 11, Nov. 2004, pp. 1765-1771.

Zannoth, Markus, et al., "A Fully Integrated VCO at 2 GHz," IEEE Journal of Solid-State Circuits, vol. 33, No. 12, Dec. 1998, pp. 1987-1991.

Zou, Jun, et al., Development of Vertical Planar Coil Inductors Using Plastic Deformation Magnetic Assembly (PDMA), 2001 IEEE International Microwave Symposium, May 2001, 4 pages.

Chang, J.Y.-C. et al., "Large Suspended Inductors on Silicon and Their Use in a 2-μm CMOS RF Amplifier," IEEE Electron Device Letters, vol. 14, No. 5, May 1993, pp. 246-248.

* cited by examiner

INTEGRATED CIRCUIT PACKAGE CONFIGURATION INCORPORATING SHIELDED CIRCUIT ELEMENT STRUCTURE

CROSS-REFERENCE TO RELATED APPLICATION(S)

This application claims the benefit under 35 U.S.C. § 119(e) of U.S. Provisional Application No. 60/418,546, filed Oct. 15, 2002, entitled "INTEGRATED CIRCUIT PACKAGE CONFIGURATION INCORPORATING SHIELDED INDUCTOR STRUCTURE", naming Derrick C. Wei, Ying Shi, Kevin G. Smith, Steven P. Proffitt, Axel Thomsen and David M. Pietruszynski as inventors, which is hereby incorporated by reference.

BACKGROUND

1. Field of the Invention

The present invention relates to integrated circuits incorporating shielded circuit structures, and more particularly to such integrated circuits incorporating inductor structures.

2. Description of the Related Art

Many modern integrated circuit devices require extremely stable oscillators to achieve desired specifications. Crystal oscillators may be employed, but typically require an off-chip crystal mounted elsewhere on a printed-wiring-board. LC oscillators offer the potential advantage of being able to incorporate such an oscillator on-chip.

To achieve an oscillator having extremely low-jitter generation, a high-Q LC oscillator is typically required. For example, a Q>30 may be required for certain applications. It is difficult to achieve such a high Q with conventional on-chip spiral inductors using the conductor and dielectric layer compositions and thicknesses which are typically encountered in traditional integrated circuit processes. For example, such on-chip spiral inductors typically achieve a Q no higher than 10–15, which is limited largely by substrate loss due to induced eddy currents in the semiconductor substrate. In addition, such spiral inductors are susceptible to electromagnetic interference from external sources of noise.

Additional improvements in high-Q LC oscillators are desired to achieve extremely stable oscillators, particularly for use as low-jitter clock sources.

SUMMARY

An electromagnetically-shielded high Q inductor may be fabricated within a multi-layer package substrate such as a ceramic package. The inductor is preferably constructed as a loop structure on one of the layers of the multi-layer substrate (MLS). The shielding structure is formed around the inductor to substantially enclose the inductor in a Faraday cage-like enclosure. In certain embodiments the shielding structure includes a top plate formed above the inductor on another layer of the MLS, and a bottom plate formed on yet another layer of the MLS or on a layer of an integrated circuit die which is below and attached to the MLS. The shielding structure includes sidewalls formed in certain embodiments by at least one ring of stacked vias, each preferably placed as close as possible to its adjacent stacked vias, to form an effective attenuating barrier to external electromagnetic (EM) interference. In other embodiments the shielding structure includes sidewalls formed by via channels to form a solid wall of conductive metal around the inductor within the MLS.

In certain embodiments the bottom plate is formed in a layer of the integrated circuit die. The die is preferably attached to the MLS by solder bumps, and a ring of solder bumps provides a connection between a portion of the sidewall formed in layers of the MLS and a portion of the sidewall formed in layers of the integrated circuit die. The inductor is preferably also connected to stacked vias which provide a connection to the underlying integrated circuit die by way of additional solder bumps and cut-outs through the bottom plate of the shielding structure. The stacked vias and solder bumps provide an extremely closely-coupled connection between the inductor and remaining circuitry to which it is coupled (i.e., providing low series inductance and resistance).

To achieve good electromagnetic shielding, the conductors forming the shielding structure are preferably high conductance structures having a thickness much thicker than the skin depth of the conductor at the operating frequency of interest. Consequently, copper or copper-alloy metal layers are preferred for both the inductor structure and the shielding structure. The metal layers of the MLS are preferably much thicker than layers commonly encountered in traditional integrated circuit processes. In certain embodiments, the metal layers are preferably approximately 10 microns thick. To achieve a high Q inductor, it is also advantageous that the dielectric thickness between the inductor and the top and bottom plates of the shielding structure be much larger than that typically encountered in traditional integrated circuit processing. In certain embodiments, the dielectric thicknesses are preferably approximately at least 150 microns thick. With such thicknesses, an inductor having a Q of 30–40 may be achieved.

In certain embodiments the bottom plate of the shielding structure is formed by an additional layer of metal formed above a traditional passivation layer covering a traditionally-fabricated top-layer of metal. Such additional layers of metal, which may be termed re-distribution layers, are preferably formed on the integrated circuit using copper or copper-alloys. In certain embodiments, such re-distribution layers are approximately 3 microns thick and have dielectric thicknesses of approximately 10 microns, depending upon the operating frequency of interest. In certain embodiments, such re-distribution layers may be incorporated into the metallization process flow of the integrated circuit, particularly if copper-based metallization is used for the traditional metal layers. In other embodiments, such re-distribution layers may be post-processed after passivation openings are cut to expose pads in the otherwise top layer of traditional metal.

In an exemplary embodiment of the invention, an integrated circuit die includes a phase locked loop circuit configured to perform clock regeneration or clock and data recovery. The PLL includes an LC oscillator circuit having an LC tank circuit in which the "capacitor" element is a variable capacitance circuit which is tuned by operation of the PLL, and the "inductor" element of the LC tank circuit is formed in the MLS. Since such an inductor structure may be a relatively large structure and behave as a rather good "antenna" for external electromagnetic fields (such as those generated by neighboring integrated circuit devices or electrical signals traversing a printed wiring board), the "inductor" element of the LC tank circuit is formed preferably as two parallel-connected inductors arranged symmetrically in a mirror image, thus forming a magnetic dipole to help offset the effects of external interference. Moreover, the shielding structure formed around the two-loop inductor structure provides substantial attenuation of stray fields from ever reaching the inductor loops. In other embodiments, two series-connected inductors may be advantageously utilized.

In a low-bandwidth PLL circuit, electromagnetic interference which couples into the PLL oscillator circuit which differs in frequency from the oscillator frequency by less than the bandwidth of the PLL is rejected by the PLL much less than higher frequency interference. Such close-in interference manifests itself as a close-in spur or by injection locking in which the PLL attempts to lock on to the interference frequency. By incorporating a shielded inductor structure, such interference may be dramatically reduced and clock jitter generation dramatically improved.

In certain aspects, the invention includes a multi-layer package substrate having an inductor structure at least partially enclosed by an electromagnetic shielding structure. In other aspects, the invention includes an integrated circuit device attached to such a multi-layer substrate. In a broader context, other circuit elements may be incorporated within such a shielding structure, either in addition to one or more inductors or instead of one or more inductors.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
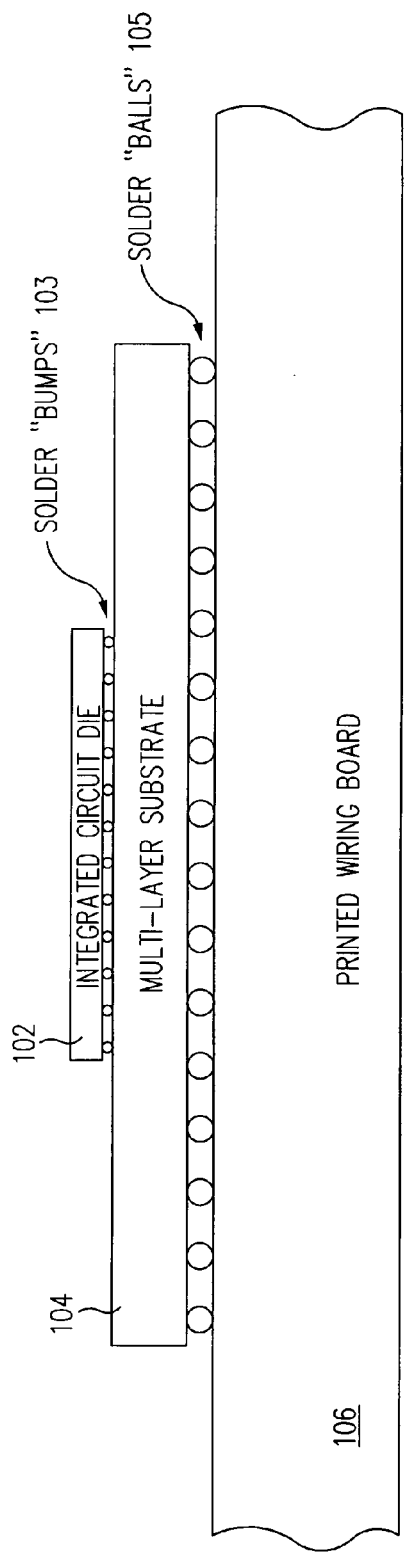
FIG. 1 is a cross-sectional diagram of an integrated circuit die attached to a multi-layer substrate, which in turn is attached to a printed wiring board.

Referring now to FIG. 1, an integrated circuit die 102 is shown attached "top-side-down" (i.e., flip-chip) to a multi-layer substrate 104 using a plurality of solder "bumps" 103. Such solder bump technology is known in the art, and its use can provide a dense array of a large number of contacts to an integrated circuit die. The multi-layer substrate 104 is attached to a printed wiring board 106 using a plurality of solder "balls" 105. Such solder ball technology is known in the art, and package types which use such solder ball technology are frequently known as ball grid array (BGA) packages. The multi-layer substrate 104 is preferably a multi-layer ceramic substrate, although other types of substrate materials, such as fiberglass, may also be utilized.

Figure 2:
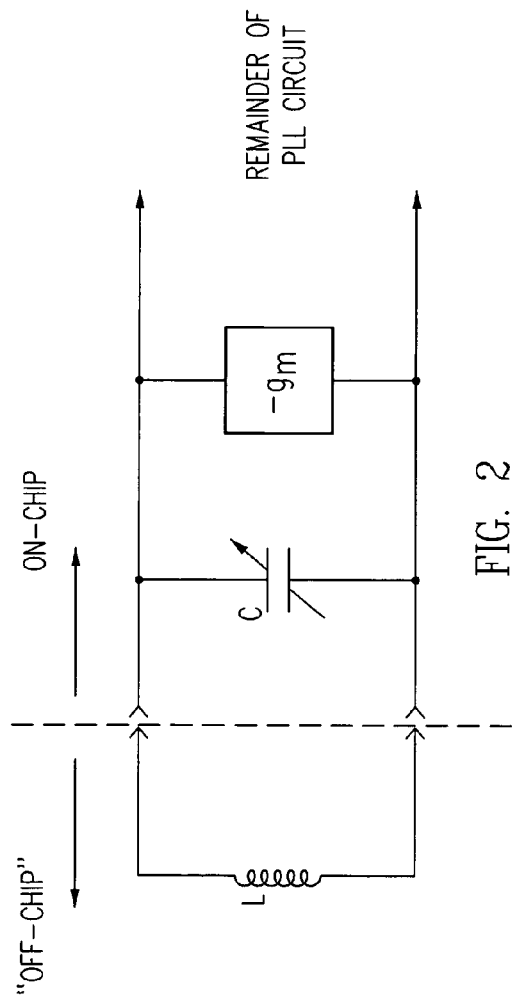
FIG. 2 is a schematic/block diagram of an LC oscillator having an inductor within its LC tank circuit located off-chip.

In one embodiment of the invention, the integrated circuit die 102 may include a low-bandwidth phase locked loop (PLL) circuit as part of a clock regeneration device. The PLL includes an LC oscillator circuit. The capacitor structures of the LC tank circuit, as well as the gain stages of the oscillator circuitry are preferably fabricated within the integrated circuit die 102, but the inductor structure of the LC tank circuit is preferably fabricated as a shielded inductor structure within the multi-layer substrate 104, as depicted in FIG. 2. The inductor structure is tightly coupled to the remainder of the tank circuit and oscillator by way of the relatively low-inductance solder bumps 103 and stacked via structures, as described below.

Figure 3A:
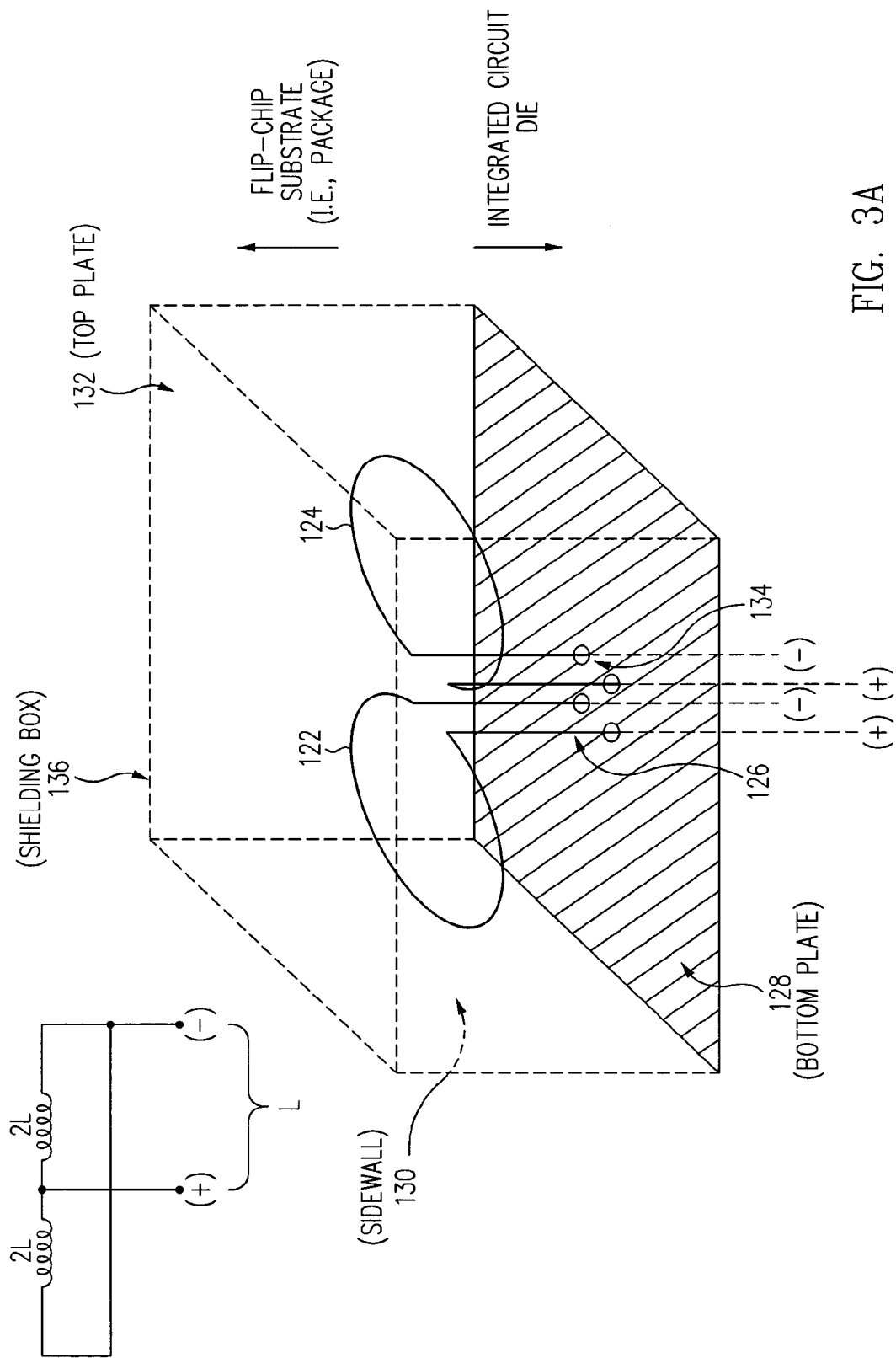
FIG. 3A is a perspective diagram depicting a two-loop inductor structure disposed within an electromagnetic shielding structure formed largely within a multi-layer substrate.
Figure 3B:
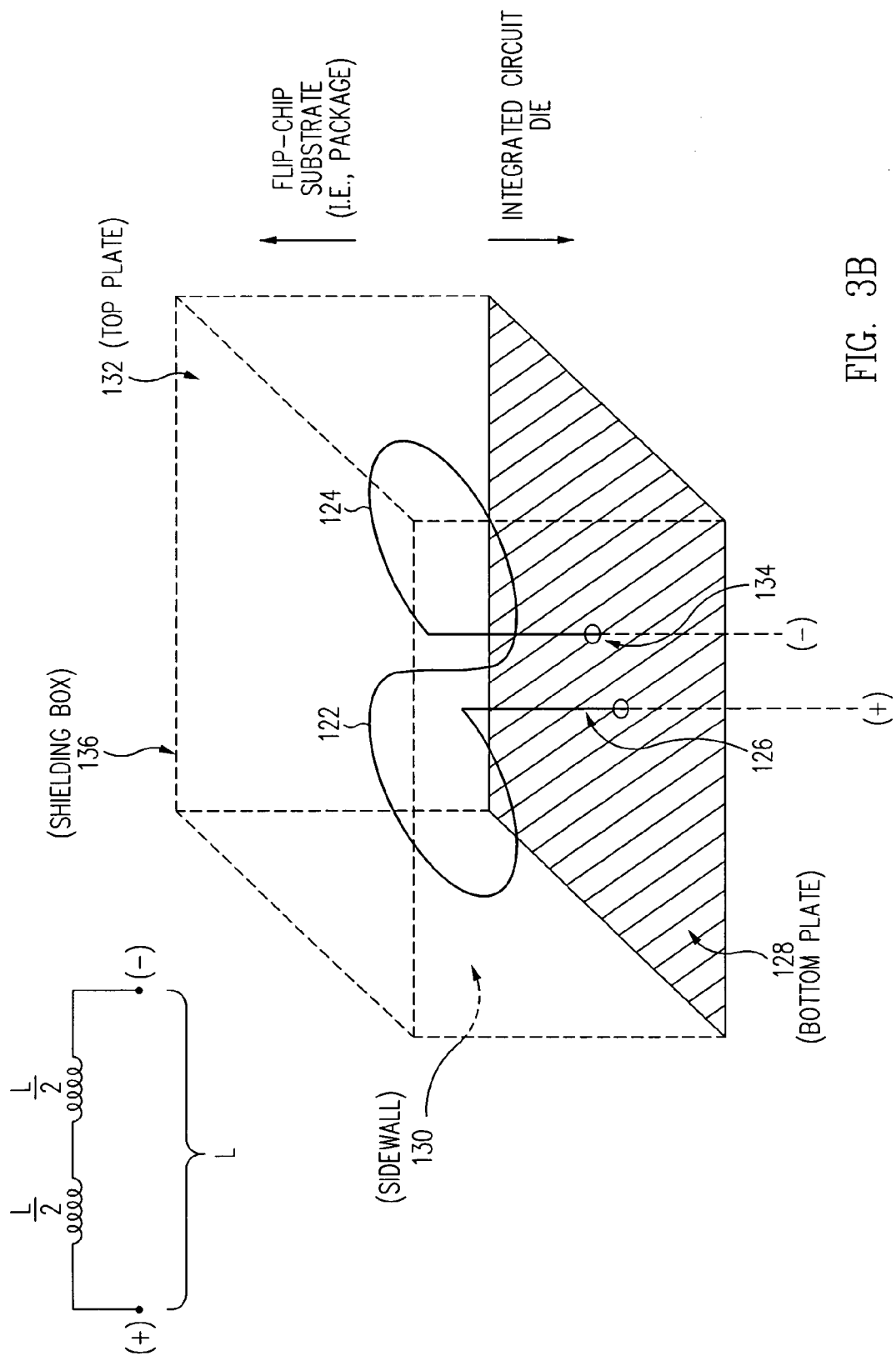
FIG. 3B is a perspective diagram depicting another two-loop inductor structure disposed within an electromagnetic shielding structure formed largely within a multi-layer substrate.

In certain embodiments the inductor structure is implemented as a two-loop structure, as shown in FIG. 3A, to implement two parallel-connected inductor coils. (FIG. 3A and remaining figures are drawn from a perspective of the integrated circuit depicted on the bottom with its top metal layer shown, and the multi-layer package on top.) This two-loop arrangement is less susceptible to external EM interference because induced current flow in one such coil is offset by an opposite current flow induced in the other coil. Multiple different layers of the multi-layer substrate 104 are used to form the shielding structure around the two coils 122, 124. To provide adequate magnetic shielding, the conductors used to form the shield structure should be much thicker than the skin depth (δ) corresponding to the target frequency, and the conductors should be of high conductivity to afford low eddy current losses. In an exemplary embodiment having an oscillator operating at 2.5 GHz, the skin depth is on the order of 1 micron, and 10 micron thick copper or copper alloy is preferably utilized. Such a metal thickness is typically unavailable in present integrated circuit metallization (although not fundamentally inconsistent), but is easily achievable within present multi-layer substrate technologies. Other metal thicknesses and compositions are also useful. In additional embodiments, the inductor structure may be implemented as two series-connected inductors, as shown in FIG. 3B.

Figure 4:
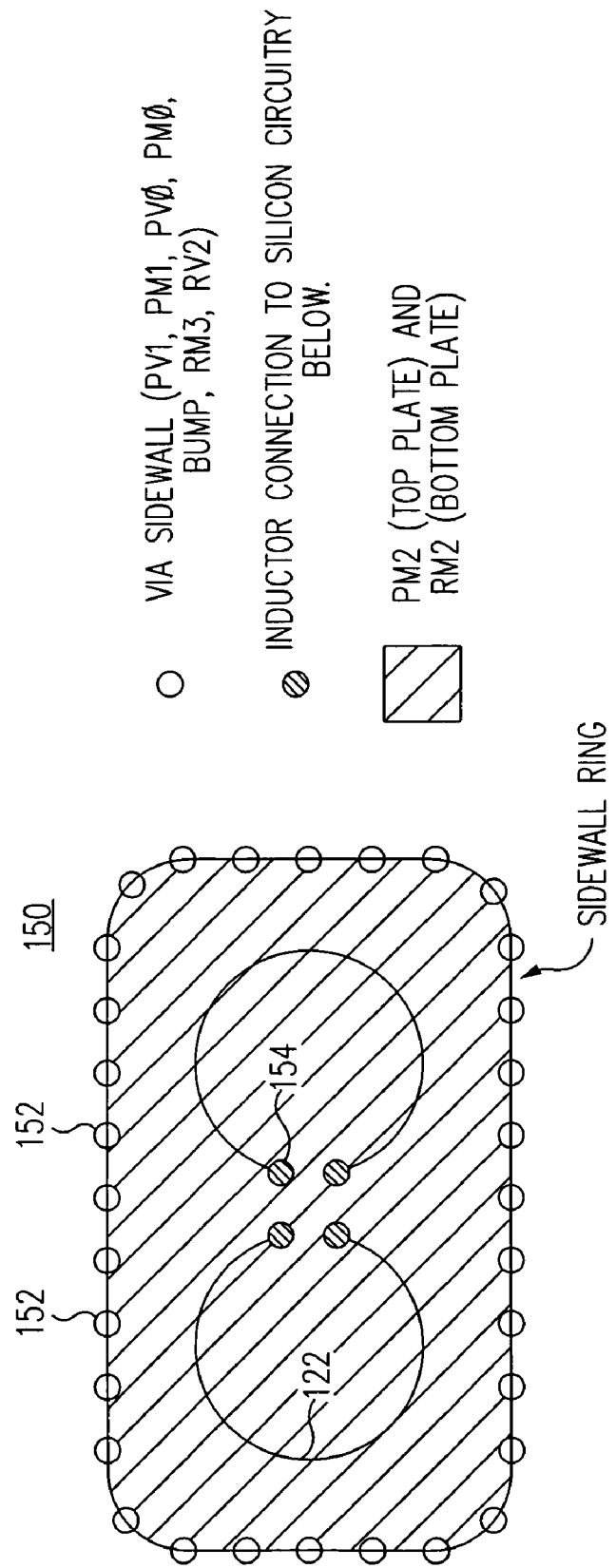
FIG. 4 is a top view of an embodiment of the structures depicted in FIG. 3A.
Figure 5:
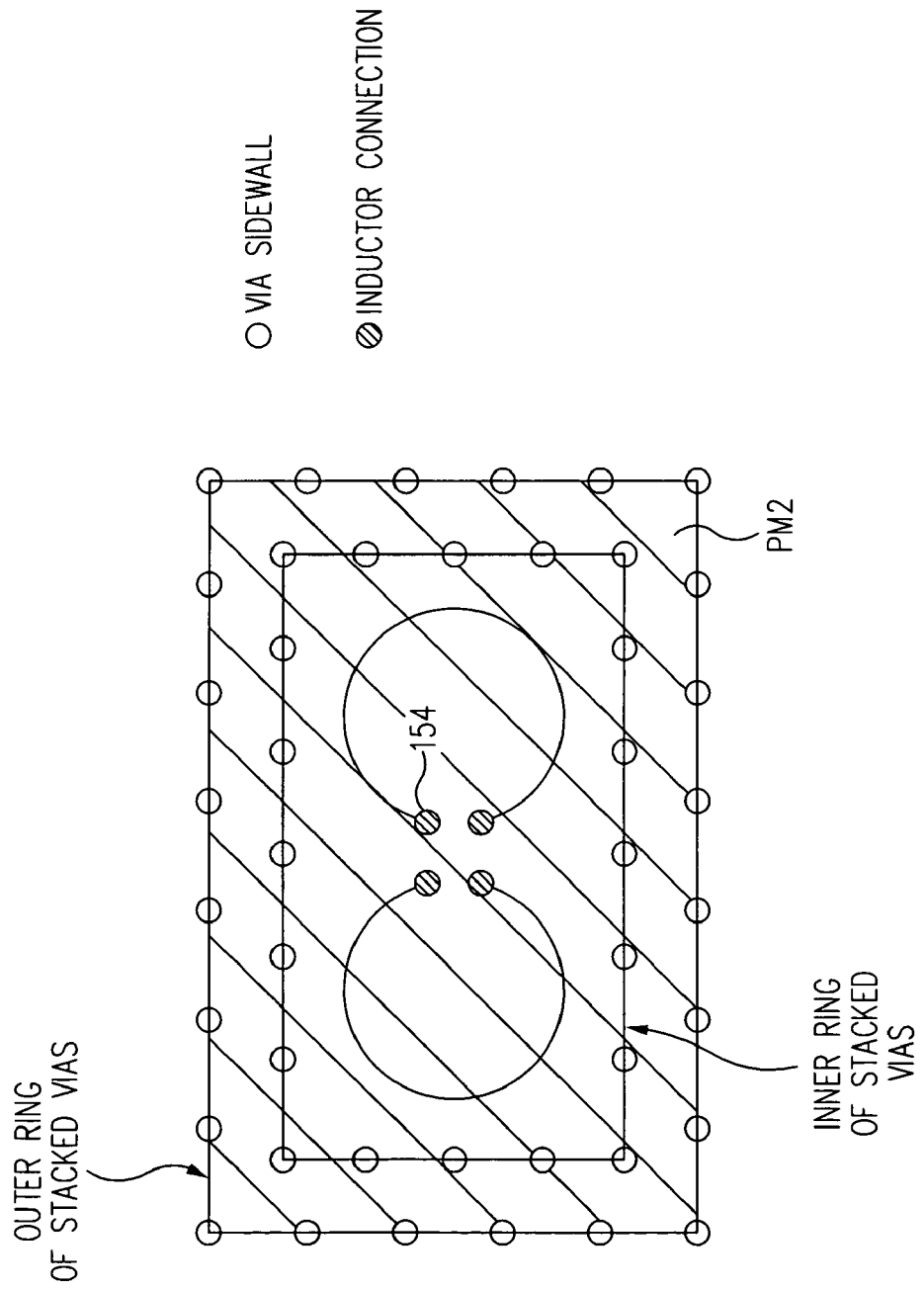
FIG. 5 is a top view of another embodiment of the structures depicted in FIG. 3A.

Preferably the shielding structure forms a 6-sided electrically-conductive box, thus forming a veritable Faraday cage around the double-loop inductors. The box is preferably formed of solid copper plates except for vias on one of its sides (e.g., via 134) to allow the inductor leads (e.g., lead 126) to pass through for connection to the integrated circuit die 102. Achieving a solid plate for the top and bottom sides (e.g., 128, 132) of the shielding box is readily achievable in a multi-layer substrate. Forming a solid plate on each of the side walls (e.g., 130) may not be readily achievable with certain multi-layer technologies. In such a case, the side wall plates may be approximated by a plurality of vias, as shown in FIG. 4. These vias are preferably spaced a minimum distance apart and are placed around the perimeter of the box. In certain embodiments, two staggered rows of vias may be employed, as shown in FIG. 5, to further reduce the effective size of the aperture formed between adjacent vias, and thus further attenuate any EM radiation entering the shielding box.

There are many different stacking arrangements contemplated for various embodiments of this invention. One particularly advantageous stacking is now described in reference to FIG. 6. An integrated circuit die 102 is shown having a layer of metallization 192 which, in particular locations, is exposed by openings 194 in a passivation layer. The metallization layer 192 may be implemented as traditional top-layer metallization of the type encountered on silicon integrated circuits, such as aluminum-based alloys or copper-based alloys having a thickness of approximately 1.0 micron, with inter-level dielectric layers also approximately 1.0 microns (although other thicknesses and compositions may also be used).

The metallization layers 202, 204, and 206 may be termed re-distribution layers RM1, RM2, and RM3 which are formed above the passivation layer as part of the integrated circuit device. These re-distribution layers are preferably formed of copper-based alloys having a thickness of approximately three microns to achieve higher conductivity than thinner aluminum-based alloys. The dielectric thickness (i.e., the vertical spacing) between re-distribution layers RM1, RM2, and RM3 is preferably approximately 10 microns. In a preferred embodiment, the bottom plate 128 of the shielding box (see FIG. 3A) is formed in the RM2 redistribution layer 204 as plate structure 216. Each electrical lead for the inductors passes through the bottom plate 216 by way of an isolated metal pad (e.g., pad 218), which forms part of a via stack between a solder bump pad (e.g., pad 220) formed in the RM3 layer 206 and the traditional top metal layer (e.g., feature 192) formed beneath the integrated circuit passivation layer.

Figure 6:
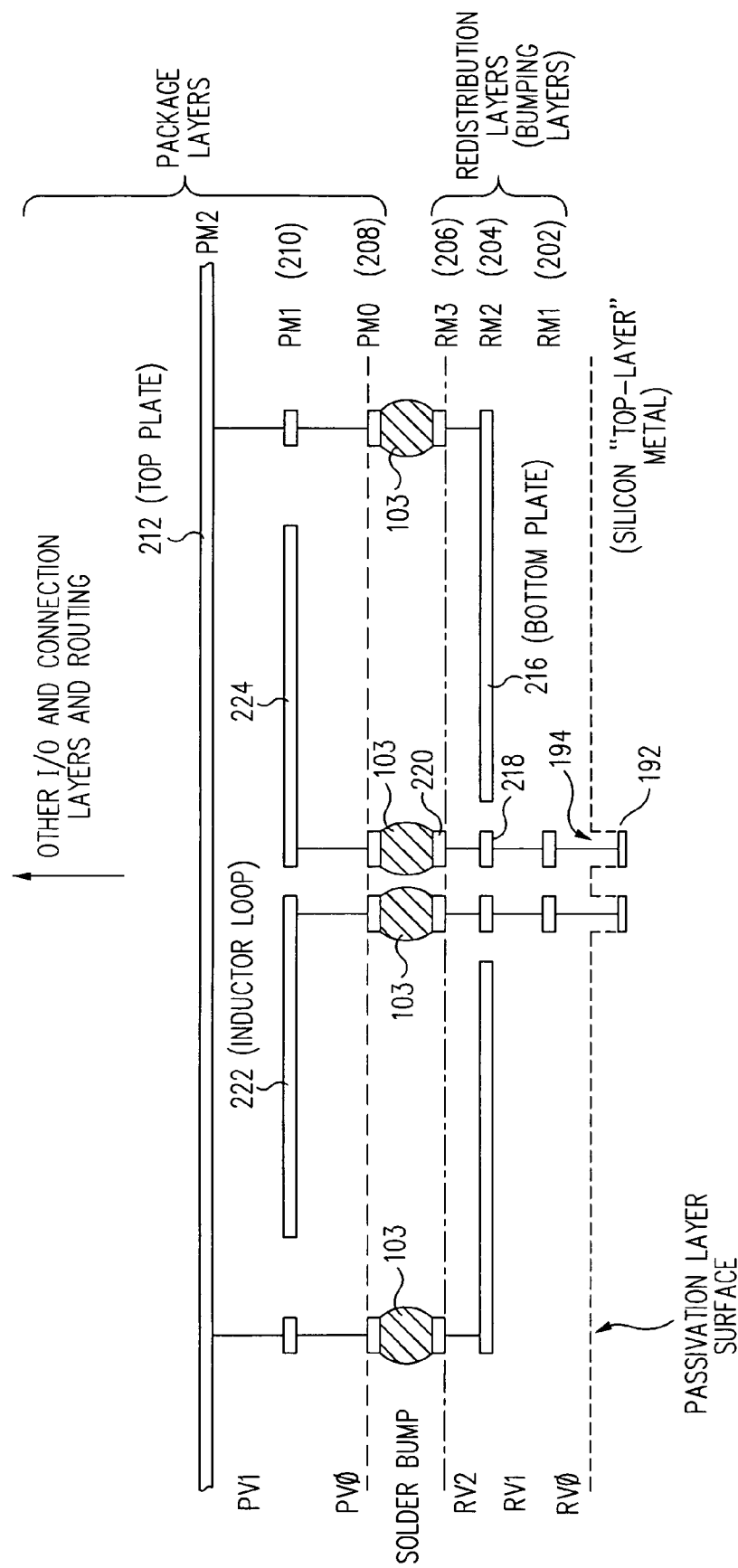
FIG. 6 is a cross-sectional view of a two-loop inductor structure disposed within an electromagnetic shielding structure formed largely within a multi-layer substrate.

The multi-layer substrate 104 (i.e., the "package") includes several metallization layers, frequently 6–8 such layers. Three of the package metal layers PM0, PM1, and PM2 are shown in FIG. 6. Remaining package layers (not shown) may be utilized for routing signal lines and power lines within the multi-layer substrate 104. The inductor coils 122 and 124 (from FIG. 3A) are shown implemented on the PM1 layer 210 as features 222 and 224. The top plate of the shielding box is implemented on the PM2 layer 212, and preferably extends beyond the sidewalls of the shielding box. In certain embodiments, the package metal layers are preferably implemented using 10 micron thick copper, with dielectric thicknesses between package metal layers approximately 150 microns thick. although other thicknesses and compositions may also be used.

Connection of the integrated circuit die 102 to the multi-layer substrate 104 is accomplished preferably by solder bumps 103. Such solder bumps form the connection from the integrated circuit to the inductors 222, 224, and also form connections which help complete the sidewalls of the shielding box. Each solder bump, once melted to form the connection, forms a metal connection approximately 75 microns thick between a pad on the re-distribution metal layer RM3 and the package metal layer PM0. In the example shown, the side walls are implemented using a "ring" of vias. The solder bumps 103 forming the sidewalls are preferably spaced laterally as close together as possible to limit the aperture size between adjacent solder bumps.

Referring back to FIG. 4, the particular stacking structure for the exemplary embodiment described thus far may be better appreciated. Each of the drawn via features (e.g., via 152) of the sidewall ring formed around the perimeter of the shielding box represents a stacked feature on via layer PV1, metal layer PM1, via layer PV0, and metal layer PM0 (of the multi-layer substrate 104), a solder bump 103, and a stacked feature on re-distribution metal layer RM3, via layer RV2, and metal layer RM2 (of the integrated circuit die 102). Each of the four drawn inductor connections to circuitry below (e.g., connection 154) represents a stacked feature on metal layer PM1, via layer PV0, and metal layer PM0 (of the multi-layer substrate 104), a solder bump 103, and a stacked feature on re-distribution metal layer RM3, via layer RV2, metal layer RM2, via layer RV1, metal layer RM1, and via layer RV0 (of the integrated circuit die 102). As used herein, a stacked via structure does not necessarily have to be aligned on all layers of the stack, as lateral offsets (i.e., staggers) between vertically adjacent layers may also be employed if desired.

Figure 7:
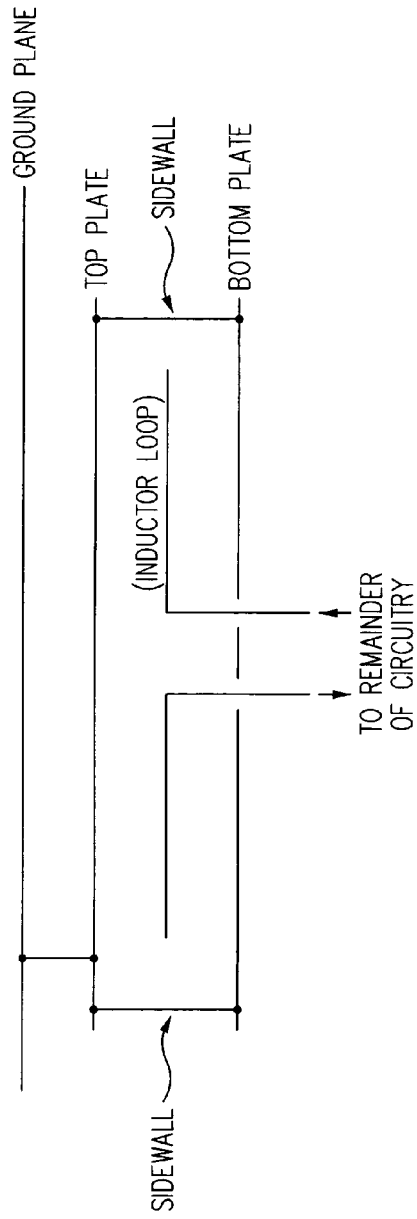
FIG. 7 is a cross-sectional view of a shielded structure, showing preferred grounding of the shielding structure.

The lateral spacing between the inductors 122, 124 and the sidewall 152 should be preferably equidistant to ensure symmetry of both loops. Likewise, the lateral spacing between the inductors 122, 124 and the other two sidewalls should respectively be equidistant. The shielding box 136 preferably should be connected to a ground node through only a single connection, to ensure that the shielding box 136 behaves as a zero-potential electrical shield. Alternatively, another equipotential node may be used to achieve substantially the same electrical shielding. Such single point grounding is preferably accomplished in the multi-layer substrate 104, as shown in FIG. 7.

Figure 8:
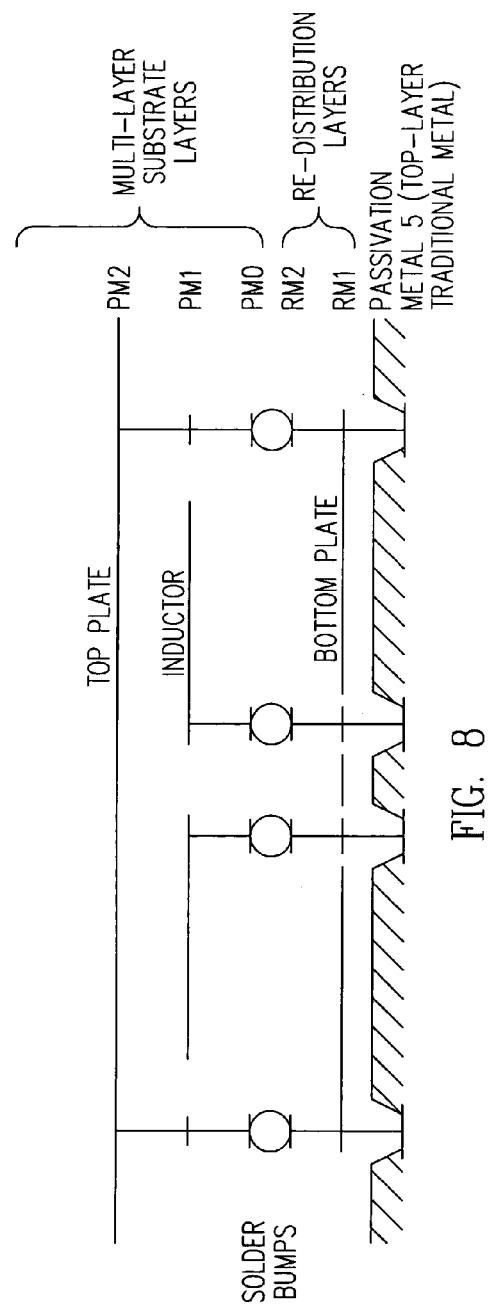
FIG. 8 is a cross-sectional view of a two-loop inductor structure disposed within an electromagnetic shielding structure formed largely within a multi-layer substrate, in which the sidewall vias extend to the traditional top-layer of metal on the integrated circuit die.
Figure 9:
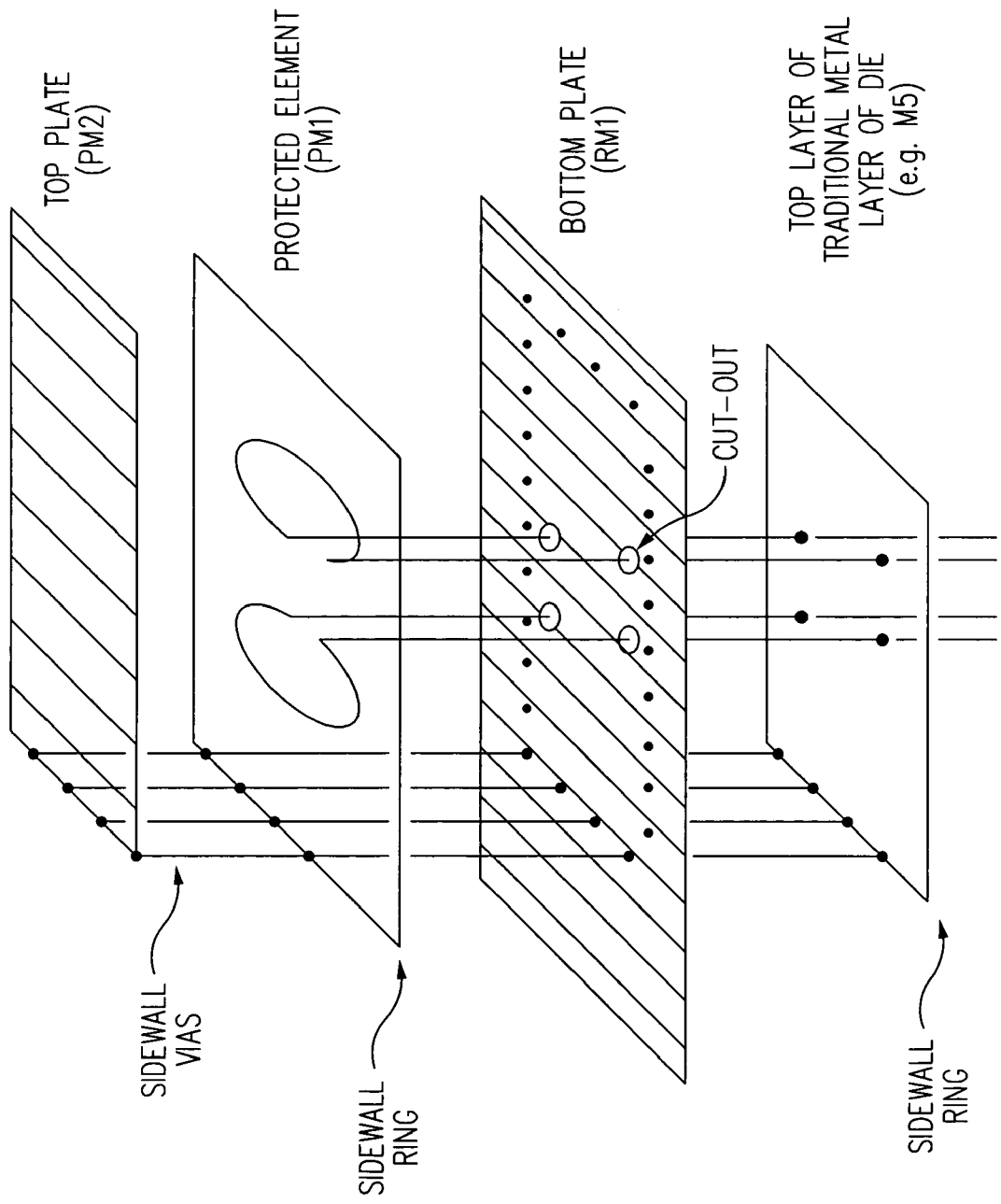
FIG. 9 is an exploded perspective view of the structure shown in FIG. 8.

In the various embodiments of the invention, it is preferred that the bottom plate and the sidewalls be extended as close to the integrated circuit as possible, to ensure maximal enclosure of the protected structure. Referring now to FIG. 8, another embodiment of a shielded inductor structure is depicted which extends the sidewalls all the way to a mating connection in the traditional top layer 192 of the integrated circuit 102 (i.e., the silicon top-layer metal). As can be appreciated, one less re-distribution layer is utilized compared to the structure shown in FIG. 6. Such a structure encloses the inductor leads even more, and provides better shielding of these inductor leads as they traverse to the integrated circuit die 102. For additional clarity, a perspective drawing of such an exemplary structure is represented in FIG. 9.

Figure 10:
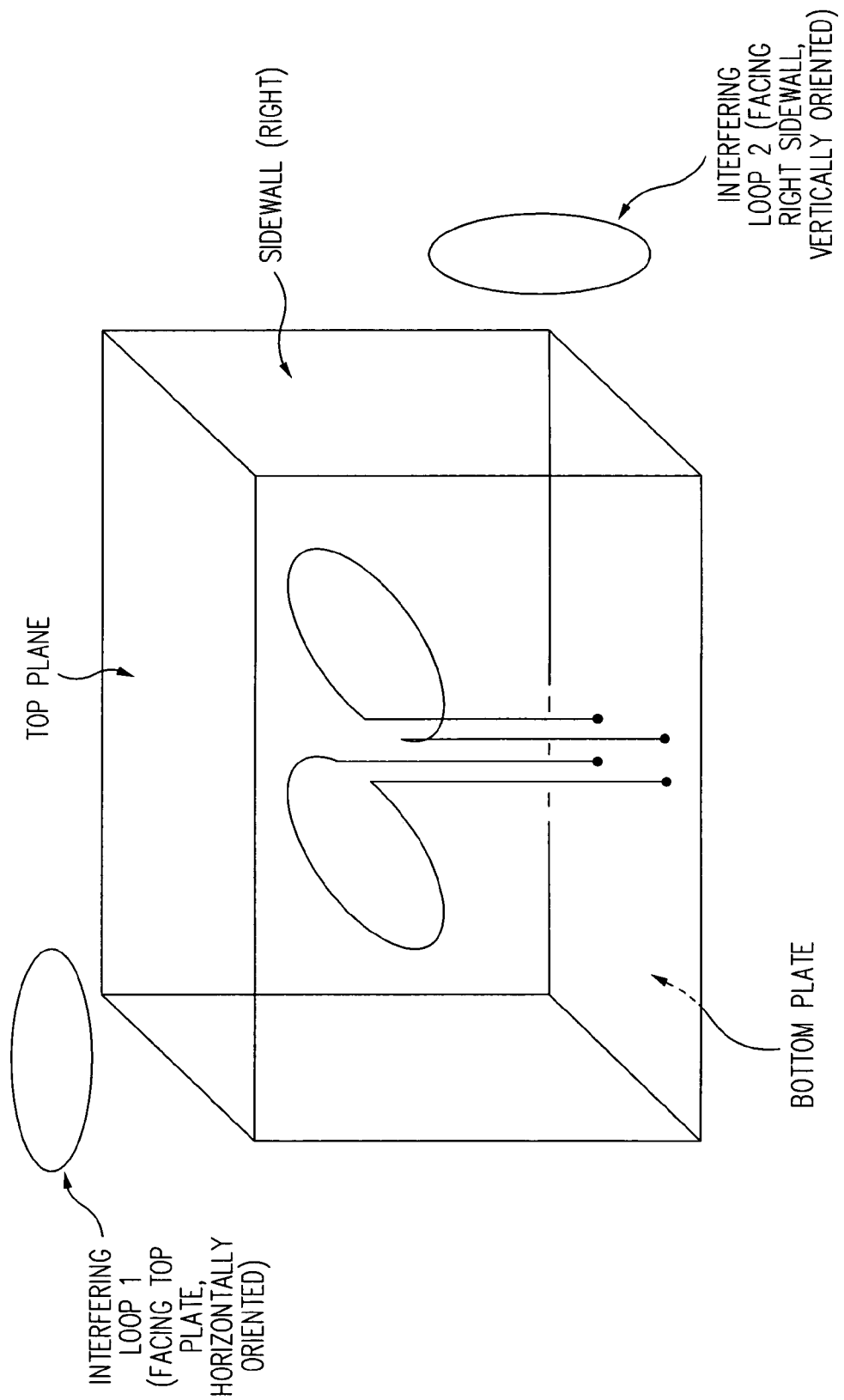
FIG. 10 is a diagram showing the placement of interfering loops relative to the shielding structure, which are used to measure the shielding effectiveness for several variations of such shielding structures.

Because of various constraints in the design of both a multi-layer substrate and the integrated circuit itself, there may be compromises reached in the structure achieved for the shielding box, and consequently, how well the box actually shields the inductor within. The effectiveness of such a shielding structure around an inductor may be modeled, and scaled models constructed upon which actual measurements may be taken, as depicted in FIG. 10. The following Table 1 provides the results of various structural combinations of such shielding boxes, for an interferer loop 1 placed horizontally facing the top plate, and for an interferer loop 2 placed vertically facing a sidewall plate.

TABLE 1

| Structure Description | Coupling by Loop 1 | Coupling by Loop 2 |
|---|---|---|
| No shield at all | 0 dB | −20 dB |
| Only bottom plate | −2 dB | +1 dB |

TABLE 1-continued

| Structure Description | Coupling by Loop 1 | Coupling by Loop 2 |
|---|---|---|
| Top and bottom plates; no sidewall | −7 dB | −6 dB |
| Top and bottom plates; only sidewall 2 using vias | −18 dB | −18 dB |
| Top and bottom plates; all sidewalls are present, using vias | −45 dB | −48 dB |
| Top and bottom plates; all sidewalls are present, using solid metal plates | −98 dB | −72 dB |

The data represented in Table 1 are obtained by an Ansoft HFSS simulator, assuming that all package metal layers are 10 micron thick copper layers. The coupling is calculated by the mutual inductance between the interfering loop and the main inductor inside the shielding structure. All feature sizes are referred to an exemplary integrated circuit device and its corresponding package.

Figure 11:
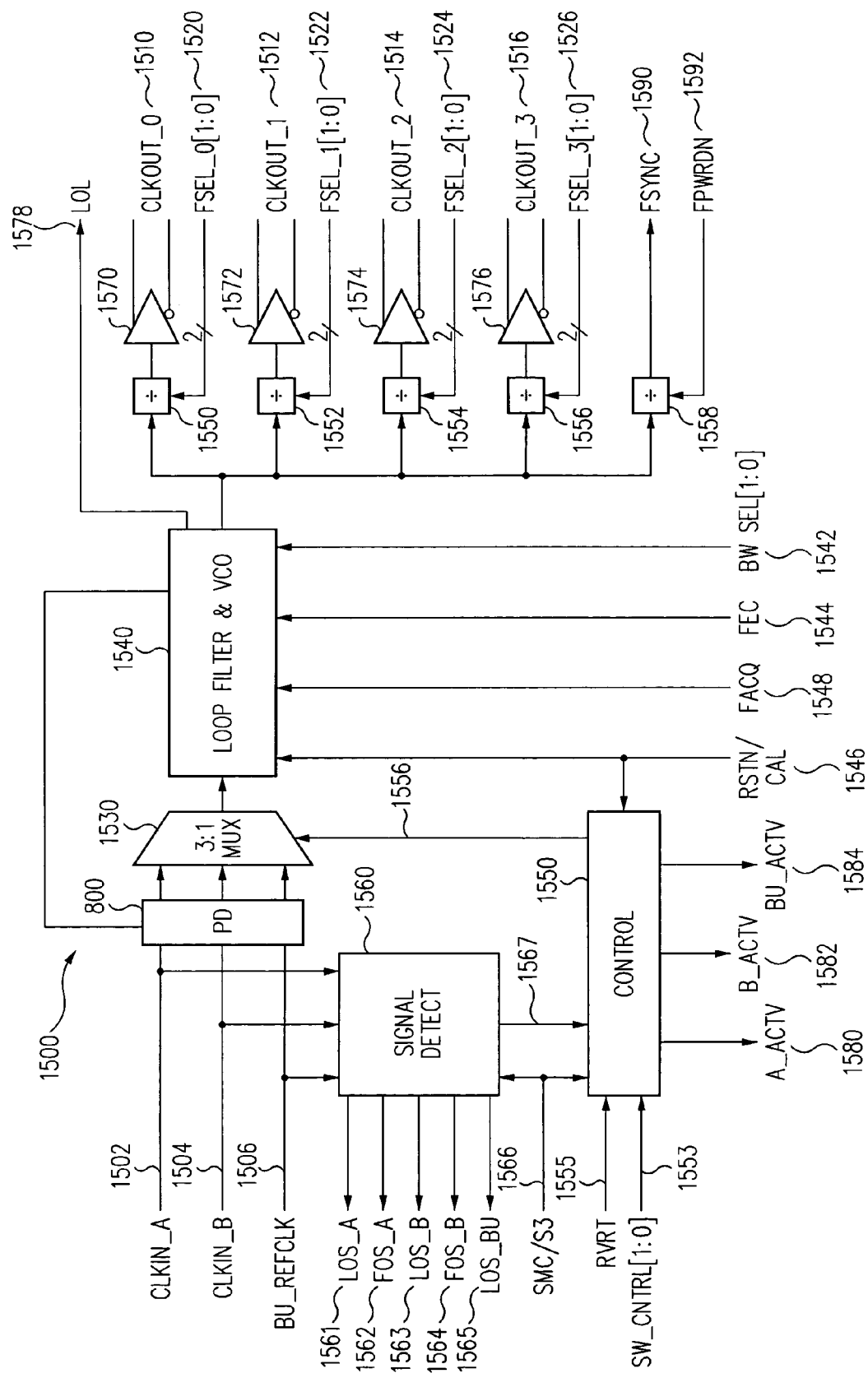
FIG. 11 is a schematic diagram of an exemplary integrated circuit device incorporating a PLL having an LC oscillator circuit which benefits from an electromagnetically shielded inductor structure in accordance with the present invention.

In one embodiment of the invention, the integrated circuit die 102 may include a low-bandwidth phase locked loop (PLL) circuit as part of a clock generation device 1500, as depicted in FIG. 11. The PLL includes an LC oscillator circuit (VCO 1540) preferably operating at 2.5 GHz. The capacitor structures of the LC tank circuit, as well as the gain stages of the oscillator circuitry are preferably fabricated within the integrated circuit die 102, but the inductor structure of the LC tank circuit is preferably fabricated as a shielded inductor structure within the multi-layer substrate 104. The inductor structure is tightly coupled to the remainder of the tank circuit and oscillator by way of the relatively low-inductance solder bumps 103.

At an operating frequency of 2.5 GHz, the skin depth is on the order of 1 micron. Preferably the re-distribution metal layers are copper or copper alloy layers approximately 3 microns thick and the inter-metallic dielectric layers therebetween are approximately 10 microns thick. The package metal layers are preferably copper or copper alloy layers about 10 microns thick and the inter-metallic dielectric layers therebetween approximately 100–150 microns thick.

When used as a precision clock circuit, an extremely low jitter signal is desired. By implementing the tank circuit inductor in the multi-layer substrate as described above, its distance to the semiconductor substrate may be increased to more than 200 microns and the substrate losses thereby substantially reduced compared to spiral inductors implemented on-chip in traditional integrated circuit metal layers. An inductor with a Q as high as 30 may be achieved.

Because a desirable inductor for this operating frequency is relatively large compared to other features on the integrated circuit (e.g., as much as 300–500 microns in diameter), such an inductor may be viewed as a "receiver" which is susceptible to external sources of EM interference unless shielded. In a situation where the external EM interference is closer to the operating frequency of the PLL than the bandwidth of the PLL, the operation of the PLL rejects such interfering frequencies less than other frequencies further from the PLL operating frequency. Injection locking may result as the PLL attempts to lock on to the interfering frequency. Shielding such an inductor from such close-in interference is vitally important to low-bandwidth, LC-oscillator based PLL circuits in order to achieve a low jitter operation when operating in a noise environment which includes such close-in interference frequencies.

While the invention has thus far been describe in the context of certain embodiments, the invention is by no means limited to such embodiments. For example, other circuit structures may be implemented within a shielding structure as described herein, rather than inductors, or in additional to inductors. For example, a shielded capacitor structure may be implemented within the multi-layer substrate 104 and closely-coupled to circuitry within the integrated circuit die 102. Moreover, the re-distribution layers may be formed after passivation openings are cut to expose the top layer of traditional metallization, or may be incorporated into a metallization process, particularly if copper-based metallization is already utilized for the other layers of the integrated circuit process.

In certain embodiments, the entire shielding structure, including the bottom layer, may be implemented within the multi-layer substrate 104, although this may increase the length of the inductor connections. Such additional length may increase the series inductance of the connection and expose the connection to additional interference from external fields (since part of the connection lead is outside the shielding box). Nevertheless, by incorporating the bottom plate within the multi-layer substrate 104, the process implications for the integrated circuit die 102 may be less demanding. If the multi-layer substrate process can provide such a structure, the side walls of the shielding structure may be formed using trench via structures to form a solid conductive plate on the sidewall.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

What is claimed is:

1. An apparatus comprising:
a multi-layer package substrate;
an integrated circuit die attached to the multi-layer package substrate;
an LC oscillator circuit formed largely within the integrated circuit die, having an LC tank circuit including at least one inductor formed within the multi-layer package substrate; and
an electromagnetic shielding structure formed around the at least one inductor.

2. The apparatus as recited in claim 1 wherein the shielding structure comprises an electrically conductive enclosure formed substantially around the at least one inductor.

3. The apparatus as recited in claim 2 wherein the shielding structure comprises an electrically conductive enclosure having a top plate, a bottom plate, and sidewalls, formed at least in part by various layers of the multi-layer package substrate.

4. The apparatus as recited in claim 3 wherein at least one of the top plate or bottom plate of the shielding structure is formed by a conductive layer of the integrated circuit die.

5. The apparatus as recited in claim 3 wherein both the top plate and the bottom plate of the shielding structure are formed by a respective conductive layer of the multi-layer package substrate.

6. The apparatus as recited in claim 3 wherein the sidewalls of the shielding structure are formed by a ring of stacked via structures in at least the multi-layer package substrate.

7. The apparatus as recited in claim 3 wherein the sidewalls of the shielding structure are formed by a ring of stacked via structures in both the integrated circuit die and the multi-layer package substrate.

8. The apparatus as recited in claim 7 wherein the stacked via structures in the integrated circuit die are connected to the stacked via structures in the multi-layer package substrate by solder bumps.

9. The apparatus as recited in claim 3 wherein the sidewalls of the shielding structure are formed by a substantially solid plate formed around the perimeter of the shielding structure in at least the multi-layer package substrate.

10. The apparatus as recited in claim 1 wherein the LC oscillator circuit forms a portion of a phase locked loop (PLL) circuit.

11. The apparatus as recited in claim 10 wherein the PLL circuit forms a portion of a clock generation circuit.

12. The apparatus as recited in claim 10 wherein the PLL circuit forms a portion of a clock and data recovery circuit.

13. The apparatus as recited in claim 1 further comprising a second inductor formed within the multi-layer package substrate, said at least one inductor and said second inductor comprising a parallel-connected pair of inductor loops forming a magnetic dipole.

14. The apparatus as recited in claim 1 further comprising a second inductor formed within the multi-layer package substrate, said at least one inductor and said second inductor comprising a series-connected pair of inductor loops.

15. An apparatus comprising:
a multi-layer package substrate;
at least one inductor formed on at least one layer of the multi-layer package substrate;
an electromagnetic shielding structure formed at least partially around the at least one inductor; and
a plurality of conductive pads for attaching an integrated circuit die to the multi-layer package substrate and for connecting the at least one inductor to the integrated circuit die; and
wherein the electromagnetic shielding structure comprises an electrically conductive enclosure having at least a top plate and sidewalls formed by various layers of the multi-layer package substrate.

16. The apparatus as recited in claim 15 further comprising conductive pads for connecting the electromagnetic shielding structure to the integrated circuit die.

17. The apparatus as recited in claim 15 wherein the shielding structure comprises an electrically conductive enclosure formed substantially around the at least one inductor.

18. The apparatus as recited in claim 15 wherein at least one of the top plate or bottom plate of the shielding structure is formed by a conductive layer of an integrated circuit die once attached to the multi-layer package substrate.

19. The apparatus as recited in claim 15 wherein both the top plate and the bottom plate of the magnetic shielding structure are formed by a respective conductive layer of the multi-layer package substrate.

20. The apparatus as recited in claim 15 wherein the sidewalls of the shielding structure are formed by a ring of stacked via structures in the multi-layer package substrate.

21. The apparatus as recited in claim 15 wherein the stacked via structures in the multi-layer package substrate include metal pads for connection of the sidewall by solder bumps to the integrated circuit die.

22. The apparatus as recited in claim 15 wherein the sidewalls of the shielding structure are formed by a substantially solid plate formed around the perimeter of the shielding structure.

23. The apparatus as recited in claim 15 further comprising a second inductor formed on at least one layer of the multi-layer package substrate, said at least one inductor and said second inductor comprising a parallel-connected pair of inductor loops forming a magnetic dipole.

24. The apparatus as recited in claim 15 further comprising a second inductor formed on at least one layer of the multi-layer package substrate, said at least one inductor and said second inductor comprising a series-connected pair of inductor loops.

25. The apparatus as recited in claim 15 further comprising an integrated circuit die, the integrated circuit die being attached to the multi-layer package substrate.

26. An apparatus comprising:
a multi-layer package substrate;
an integrated circuit die attached to the multi-layer package substrate;
at least one circuit element formed on one or more layers of the multi-layer package substrate and coupled to remaining circuitry within the integrated circuit die; and
an electromagnetic shielding structure formed at least partially around the at least one circuit element; and
wherein the electromagnetic shielding structure comprises an electrically conductive enclosure having a top plate, a bottom plate, and sidewalls, formed at least in part by various layers of the multi-layer package substrate.

27. The apparatus as recited in claim 26 wherein at least one of the top plate or bottom plate of the electromagnetic shielding structure is formed by a conductive layer formed on the integrated circuit die.

28. The apparatus as recited in claim 26 wherein both the top plate and the bottom plate of the electromagnetic shielding structure are formed by a respective conductive layer of the multi-layer package substrate.

29. The apparatus as recited in claim 26 wherein the sidewalls of the electromagnetic shielding structure are formed by a ring of stacked via structures in at least the multi-layer package substrate.

30. The apparatus as recited in claim 26 wherein the sidewalls of the electromagnetic shielding structure are formed by a ring of stacked via structures in both the integrated circuit die and the multi-layer package substrate.

31. The apparatus as recited in claim 30 wherein the stacked via structures forming the sidewall in the integrated circuit die are connected by solder bumps to the stacked via structures forming the sidewall in the multi-layer package substrate.

32. The apparatus as recited in claim 26 wherein the sidewalls of the electromagnetic shielding structure are formed by a substantially solid plate formed around the perimeter of the shielding structure in at least the multi-layer package substrate.

33. The apparatus as recited in claim 26 wherein the at least one circuit element comprises an inductor structure.

34. The apparatus as recited in claim 33 wherein the inductor structure comprises a parallel-connected pair of inductor loops forming a magnetic dipole.

35. The apparatus as recited in claim 33 wherein the inductor structure comprises a series-connected pair of inductor loops.

36. The apparatus as recited in claim 26 wherein the at least one circuit element comprises a capacitance structure.

37. A computer-readable medium encoding an apparatus, the encoded apparatus comprising:
a multi-layer package substrate;
at least one inductor formed on one or more layers of the multi-layer package substrate;
an electromagnetic shielding structure formed at least partially around the at least one inductor;
a plurality of conductive pads for attaching an integrated circuit die to the multi-layer package substrate and for connecting the at least one inductor to the integrated circuit die; and
wherein the encoded electromagnetic shielding structure comprises an electrically conductive enclosure having at least a top plate and sidewalls formed by various layers of the multi-layer package substrate.

38. The computer-readable medium as recited in claim 37 wherein at least one of the top plate or bottom plate of the encoded electromagnetic shielding structure is formed by a conductive layer on an integrated circuit die once attached to the multi-layer package substrate.

39. The computer-readable medium as recited in claim 37 wherein both the top plate and the bottom plate of the encoded electromagnetic shielding structure are formed by a respective conductive layer of the multi-layer package substrate.

40. The computer-readable medium as recited in claim 37 wherein the encoded multi-layer package further comprises conductive pads for connecting the sidewall in the multi-layer package substrate to corresponding sidewall structures of an integrated circuit die.

41. The computer-readable medium as recited in claim 37 wherein the sidewalls of the encoded electromagnetic shielding structure are formed by a ring of stacked via structures in the multi-layer package substrate.

42. The computer-readable medium as recited in claim 37 wherein the sidewalls of the encoded electromagnetic shielding structure are formed by a substantially solid plate formed around the perimeter of the shielding structure in the multi-layer package substrate.

43. The computer-readable medium as recited in claim 37 wherein the inductor structure comprises a parallel-connected pair of inductor loops forming a magnetic dipole.

* * * * *